United States Patent
Ichihara

(10) Patent No.: US 8,050,367 B2
(45) Date of Patent: Nov. 1, 2011

(54) RECEIVING AMPLITUDE CORRECTION CIRCUIT, RECEIVING AMPLITUDE CORRECTION METHOD, AND RECEIVER USING THE SAME

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 853 days.

(21) Appl. No.: 12/066,877

(22) PCT Filed: Sep. 14, 2006

(86) PCT No.: PCT/JP2006/318665
§ 371 (c)(1),
(2), (4) Date: Mar. 14, 2008

(87) PCT Pub. No.: WO2007/032550
PCT Pub. Date: Mar. 22, 2007

(65) Prior Publication Data
US 2009/0285340 A1 Nov. 19, 2009

(30) Foreign Application Priority Data
Sep. 14, 2005 (JP) .................................. 2005-266179

(51) Int. Cl.
*H04L 27/08* (2006.01)
(52) U.S. Cl. ........ 375/345; 375/316; 375/342; 375/344; 375/346; 375/349; 455/296; 455/302
(58) Field of Classification Search .................. 375/147, 375/232, 260, 271, 316, 342, 345, 346, 347, 375/349, 350, 306
See application file for complete search history.

(56) References Cited

U.S. PATENT DOCUMENTS

| | | | |
|---|---|---|---|
| 5,467,399 A * | 11/1995 | Whitecar | 381/4 |
| 7,809,047 B2 * | 10/2010 | Kummetz | 375/211 |
| 7,907,589 B2 * | 3/2011 | Shimizu et al. | 370/345 |
| 2002/0102941 A1 * | 8/2002 | Kuiri et al. | 455/63 |
| 2002/0163979 A1 * | 11/2002 | Takatz et al. | 375/345 |
| 2002/0181568 A1 | 12/2002 | Prater | |
| 2003/0064695 A1 * | 4/2003 | Shi | 455/302 |
| 2004/0097212 A1 * | 5/2004 | Matsumoto et al. | 455/296 |
| 2006/0017602 A1 * | 1/2006 | Puma et al. | 341/164 |

FOREIGN PATENT DOCUMENTS

| | | |
|---|---|---|
| EP | 1326347 A | 7/2003 |
| JP | 2000252868 A | 9/2000 |
| JP | 2001168664 A | 6/2001 |
| JP | 2004153718 A | 5/2004 |
| WO | 2004068754 A1 | 8/2004 |

* cited by examiner

*Primary Examiner* — Shuwang Liu
*Assistant Examiner* — Hirdepal Singh

(57) ABSTRACT

Input average levels and output average levels of digital channel filters 217 and 218 are computed in amplitude calculation circuits 101 and 102. In a gain difference calculation circuit 103, a gain difference of the input levels and the output levels is computed as a multiplier α so that a difference between the input levels and the output levels are eliminated or adjusted to be within a certain value. The outputs of the digital channel filters 217 and 218 are multiplied by the multiplier α in multiplier units 104 and 105. The multiplication results are outputted as corrected digital signals to a subsequent digital signal processing circuit.

9 Claims, 7 Drawing Sheets

RECEIVING AMPLITUDE CORRECTION CIRCUIT, RECEIVING AMPLITUDE CORRECTION METHOD, AND RECEIVER USING THE SAME

TECHNICAL FIELD

The present invention relates to a receiving amplitude correction circuit, a receiving amplitude correction method, and a receiver using the same, and more particularly to a receiving amplitude correction circuit suitable for use in a wireless communication apparatus having an AGC function and employing a direct-conversion receiving method.

BACKGROUND ART

Receivers in a wireless communication apparatus include a direct-conversion type receiver as shown in FIG. 1. Referring to FIG. 1, radio-frequency signals received by an antenna 201 are amplified by a low-noise amplifier (hereinafter abbreviated to "LNA") 202. Practically, a duplexer, a radio-frequency filter (a broad-band filter that is not used to limit a channel band), and the like are provided between the antenna 201 and the LNA 202. However, they are omitted from the drawings.

The entire receiving band, which is not a channel, is extracted from the signals amplified in the LNA202 by a radio-frequency band-pass filter (hereinafter abbreviated to "RF BPF") 203, so that signals in bands other than the receiving band, such as a transmitting signal transmitted by the wireless communication apparatus itself, are suppressed. The output of the RF BPF 203 is inputted to a quadrature demodulator circuit 204. The quadrature demodulator circuit 204 demodulates the input signal and outputs an I component that is an in-phase component and a Q component that is a quadrature component.

The quadrature demodulator circuit 204 has a buffer amplifier 221, multiplier units 222 and 223 as balanced mixers, a quadrature signal generator 224, and a local oscillator 225. This type of devices is well-known, and detailed explanation thereof is therefore omitted. The I component and the Q component demodulated by the quadrature demodulator circuit 204 are inputted to base band filters (hereinafter abbreviated to "BB BPF") 205 and 206, where those components are respectively limited in band. Each of the BB BPFs 205 and 206 is a band-pass filter (BPF). This is not only for the purpose of suppressing adjacent channel components to remove an DC offset produced in the quadrature demodulator circuit 204, but also for the purpose of suppressing low-frequency components that are very close to a direct current. Hereinafter, this type of filter is referred to as a channel filter.

The I component and the Q component limited in band by the channel filters 205 and 206 are inputted into a base band circuit 207. The base band circuit 207 has variable gain amplifiers (hereinafter abbreviated to "VGA") 208, 209, 210, 211, 212, and 213, A/D converters 215 and 216, and a gain controller 214. In the base band circuit 207, the I component and the Q component limited in band are amplified by the VGAs 208-210 and 211-213, respectively, to certain levels at which an optimum conversion process can be performed in the subsequent A/D converters 215 and 216. In FIG. 1, the VGAs are illustrated as having a three-stage arrangement. However, the VGAs may have any arrangement as long as they have one or more stages. Furthermore, the positional relationships between the channel filter 205 and the VGAs 208-210 and between the channel filter 206 and the VGAs 211-213 are not limited to the example shown in FIG. 1. Moreover, each of the channel filters 205 and 206 may be divided into a plurality of stages and disposed between the VGAs.

The I component output and the Q component output at the final stage of the VGAs are subjected to A/D conversion in the A/D converters 215 and 216, respectively, and transmitted to a subsequent digital signal processing circuit (see FIG. 2).

FIG. 2 is a diagram showing the digital signal processing circuit 100. A digital amplitude calculator 303 calculates an average amplitude of the signals, for example, within one slot in CDMA or TDMA from the digital I signal and Q signal transmitted from the base band circuit 207 shown in FIG. 1. Subsequently, a subtractor 302 computes a difference between the calculation result of the average amplitude and a targeted reference amplitude. The computed difference is inputted into a digital gain control data generator 301. The digital gain control data generator 301 generates gain control data for controlling gains of the VGAs from the computed difference.

The gain control data are transmitted to the gain controller 214 shown in FIG. 1. The gain controller 214 controls the gains of the VGAs 208-210 and 211-213 based on the gain control data. In this case, the gain control data may be analog signals or digital signals. Furthermore, FIG. 1 shows that all of the VGAs are collectively provided in the base band circuit 207. However, the LNA 202 or the buffer amplifier 221 can also be used as a VGA. In such a case, as a matter of course, the gain of the LNA 202 or the buffer amplifier 221 is controlled by the gain control data from the gain controller 214.

With the above arrangement and operation, the signal levels of the I component and the Q component are automatically adjusted so that the levels of the input signals to the A/D converters 215 and 216 optimally fall within dynamic ranges of the A/D converters 215 and 216 (AGC).

An example of AGC in this type of receiver is disclosed in Patent Document 1 (Japanese laid-open patent publication No. 2001-168664).

In the existing communication systems such as CDMA and W-CDMA, direct-conversion type receivers as shown in FIG. 1 have worked well without any problems. However, higher-speed transmission systems, such as HSDPA (High Speed Downlink Packet Access) system in 3GPP (Third Generation Partnership Project), have been developed progressively in recent years. The HSDPA system adopts not only QPSK demodulation but also downstream modulation such as 16-QAM. Furthermore, it requires high-speed data transfer having an extremely low spreading rate. In order to meet such demands, it is necessary to require a higher degree of demodulation precision at a receiving end of a communication terminal device.

For example, while an EVM (Error Vector Magnitude) of about 15% to about 20% has been required in the conventional technology, the HSDPA system is considered to require an EVM of 5% or less. It is difficult to implement such high-precision demodulation when an analog channel filter is used. For example, it is not easy to maintain an EVM of 5% or less because of variations of characteristics or time-varied characteristics of parts comprising an analog channel filter.

Thus, there is considered a method of forming channel filters by digital filters and disposing them on the downstream side of the A/D converters. Because a digital filter does not cause variations of characteristics or time-varied characteristics of parts, a high-precision demodulation can be achieved.

An example in which the channel filters are formed by digital filters is shown in FIG. 3. In FIG. 3, equivalent parts to those shown in FIG. 1 are denoted by the same reference numerals.

FIG. 3 shows an example in which the channel filters 205 and 206 shown in FIG. 1 are respectively replaced with digital filters (DLPF) 217 and 218, which are disposed on the downstream side of the A/D converters 215 and 216. Here, the channel filters for digital processing are formed by low-pass filters. However, those channel filters may be high-pass filters for removing a DC offset. Furthermore, low-pass filters for preventing aliasing caused by A/D conversion may be left on the upstream side of the A/D converters 215 and 216.

FIG. 4 shows an example of frequency characteristics of the digital filters 217 and 218. As shown in FIG. 4, the frequency characteristics exhibit that signals in bands for a desired channel to be received are straightly passed as much as possible while signals in bands for the rest of the channels including an adjacent channel are suppressed. Usually, the frequency characteristics should be infinitely close to root cosine roll-off characteristics in order to reduce the EVM. Practically, such a design is possible.

FIGS. 5A and 5B show an example of level changes of a desired wave and an interference wave in an adjacent channel in a case where those waves pass through a digital filter having frequency characteristics shown in FIG. 4. Even though the interference wave in the adjacent channel is extremely greater than the desired wave on the input side of the digital channel filters 217 and 218 as shown in FIG. 5A, the interference wave is remarkably suppressed by the frequency characteristics of the digital channel filters 217 and 218 after the waves have passed through the digital channel filters 217 and 218 as shown in FIG. 5B. Accordingly, the level of the interference wave becomes lower than that of the desired wave.

Thus, the level of the interference wave greatly changes between before and after the digital channel filters 217 and 218. If the digital I signal and Q signal in which an interference wave have been suppressed are inputted to the digital signal processing circuit 100 shown in FIG. 2, then the digital amplitude calculator 303 underestimates the interference wave to compute an average amplitude, as compared to the case the digital signal processing circuit 100 is disposed immediately after the A/D converters 215 and 216. This means that the difference between the computed average amplitude and the reference amplitude becomes smaller than the actual difference. As a result, excessive gain control data is generated in the digital signal processing circuit 100, causing excessive gains in the VGA.

At that time, there may arise a problem that the amplitudes at the inputs of the A/D converters 215 and 216 deviate from an appropriate input range of the A/D converters 215 and 216 due to the interference wave in the adjacent channel. In such a situation, the A/D converters 215 and 216 are not expected to work correctly. As a result, the A/D converters 215 and 216 do not correctly function as receivers.

For AGC control, a receiver disclosed in Patent Document 1 detects an average amplitude of input signals to a digital channel filter and generates a AGC control signal in accordance with a difference between the detected average amplitude and a reference value. Thus, that receiver does not detect an average amplitude of output signals of the digital channel filter to perform AGC control.

It is an object of the present invention to provide a receiving amplitude correction circuit capable of controlling an A/D converter so as to work correctly to maintain a function of a receiver in a case where, using a digital channel filter as a channel filter, an AGC control is performed in accordance with an average amplitude of output signals of the digital channel filter, a receiving amplitude correction method, and a receiver using the same.

DISCLOSURE OF INVENTION

The aforementioned problems in the prior art are caused by the fact that input and output levels of the digital channel filter are not equal to each other or are not within a range of a predetermined level difference when there are a desired wave and an interference wave other than the desired wave. Therefore, the present invention adopts such arrangement that the input and output levels of the digital channel filter are made averagely substantially equal to each other or adjusted to have a predetermined level difference.

A receiving amplitude correction circuit according to the present invention is applied to a receiver including an A/D conversion unit operable to convert a received analog signal into a digital signal, a band limitation unit operable to limit bands of the digital signal, a digital signal processing unit operable to conduct a digital signal processing after the band limitation, and a gain controller operable to perform a gain control to control a level of the received analog signal based on a signal level in the digital signal processing unit. The receiving amplitude correction circuit is characterized by including a correction unit operable to correct digital signal amplitudes before and after the band limitation unit so that the amplitudes are made averagely equal to each other or adjusted to have a predetermined difference.

A receiving amplitude correction method according to the present invention is applied to a receiver which converts a received analog signal into a digital signal, limits bands of the digital signal by a band limitation unit, conducts digital signal processing after the band limitation by a digital signal processing unit, and performs a gain control to control a level of the received analog signal based on a signal level in the digital signal processing unit. The receiving amplitude correction method is characterized by including a correction step of correcting digital signal amplitudes before and after the band limitation unit so that the amplitudes are made averagely equal to each other or adjusted to have a predetermined difference.

A receiver according to the present invention is characterized by including the aforementioned receiving amplitude correction circuit.

According to the present invention, an amplitude of a digital signal before an interference wave has been suppressed by a digital filter as a channel filter and an amplitude of a digital signal after the interference wave has been suppressed are made averagely substantially equal to each other or adjusted to have a predetermined difference. Thus, it is possible to prevent a situation in which signal levels deviate from an A/D conversion range (dynamic range of an A/D conversion unit) at the input of the A/D conversion unit.

BEST MODE FOR CARRYING OUT THE INVENTION

Figure 6:
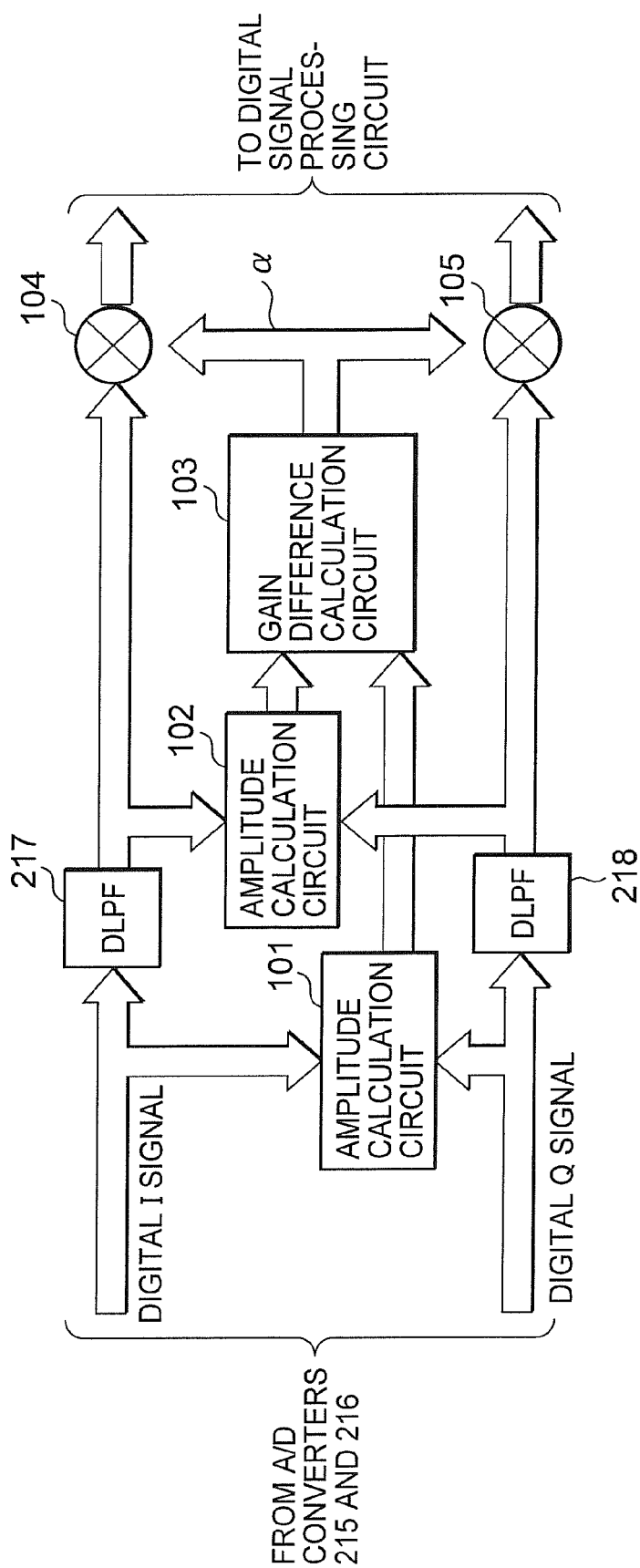
FIG. 6 is a block diagram showing an arrangement of a receiver according to an embodiment of the present invention.

Embodiments of the present invention will be described below with reference to the drawings. FIG. 6 is a block diagram showing an embodiment of a receiving amplitude correction circuit according to the present invention, which can be applied to the receiver shown in FIG. 3. The receiving amplitude correction circuit has an amplitude calculation circuit 101 (first calculation unit) operable to calculate an average amplitude of inputs of the I data and the Q data (to be inputted) immediately before the digital low-pass filters (DLPF) 217 and 218 as the channel filters shown in FIG. 3 and an amplitude calculation circuit 102 (second calculation unit) operable to calculate an average amplitude of inputs of the I data and the Q data (outputted) immediately after the digital low-pass filters (DLPF) 217 and 218. It is desirable that the period within which an average of the amplitude is calculated be a slot, which is a minimum unit forming a communication frame. Nevertheless, that period is not limited to a slot.

The outputs of the amplitude calculation circuits 101 and 102 are inputted to a gain difference calculation circuit 103 (computation unit). The gain difference calculation circuit 103 computes a multiplier α for multiplier units 104 and 105 based on the average amplitudes calculated by the amplitude calculation circuits 101 and 102. The respective outputs of the channel filters 217 and 218 are multiplied by the multiplier α in the multiplier units 104 and 105, respectively. Those multiplication results are introduced as a digital I signal and Q signal to a digital signal processing circuit. Components other than stated above may be the same as those shown in FIG. 3, and the details thereof are omitted. Furthermore, the digital signal processing circuit may be the same as the digital signal processing circuit 100 illustrated in FIG. 2. The amplitude calculation circuits 101, 102, the gain difference calculation circuit 103, and the multiplier units 104 and 105 may collectively be referred to as a correction unit. Furthermore, the gain difference calculation circuit 103 and the multiplier units 104 and 105 may collectively be referred to as an amplitude correction unit.

With the above arrangement, it is assumed that the number of the samples in each of the I data and the Q data included in one slot is N, that the I sample value and Q sample value immediately before the channel filters 217 and 218 are Iinj and Qinj, respectively, and that the I sample value and Q sample value immediately after the channel filters 217 and 218 are Ioutj and Qoutj, respectively. In this case, an average amplitude Ain immediately before the channel filters 217 and 218 and an average amplitude Aout immediately after the channel filters 217 and 218 at a certain slot are defined by the following formulas (1) and (2).

$$Ain = \sqrt{\frac{\sum_{j=1}^{N}(I_{inj}^2 + Q_{inj}^2)}{N}} \quad (1)$$

$$Aout = \sqrt{\frac{\sum_{j=1}^{N}(I_{outj}^2 + Q_{outj}^2)}{N}} \quad (2)$$

The gain difference calculation circuit 103 computes a multiplier a for the multiplier units 104 and 105 used in the next slot with use of these average amplitudes Ain and Aout. The multiplier a is represented by the following formula (3).

$$a = Ain/Aout \quad (3)$$

In the next slot, the respective outputs of the channel filters 217 and 218 are multiplied by the computed multiplier a in the multiplier units 104 and 105, respectively. Those multiplication results are outputted as a digital I signal and Q signal to the digital signal processing circuit.

In other words, a reciprocal of a ratio (Aout/Ain) of the average amplitude immediately before the channel filters 217 and 218 and the average amplitude immediately after the channel filters 217 and 218 is computed as a multiplier α. The outputs of the channel filters 217 and 218 are multiplied by the multiplier α. By this operation, the amplitude immediately before the channel filters 217 and 218 can be made substantially equal to the amplitude immediately after the multiplier units 104 and 105 while small fluctuations between slots are unavoidable. If α·k, where k is a constant not less than 1, is used for multiplication instead of the multiplier α, a certain level difference corresponding to the constant k can be provided.

Figures 7A, 7B, 7C:
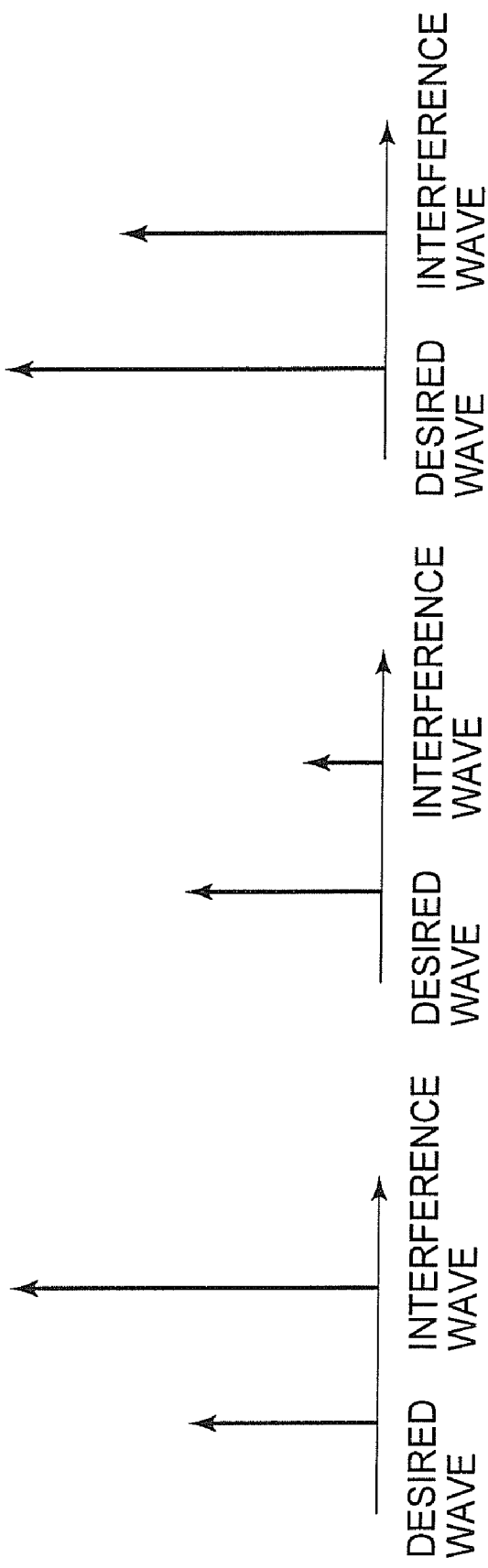
FIGS. 7A to 7C are graphs showing levels of signals at several portions in a circuit of FIG. 6.

FIGS. 7A to 7C show changes of levels of a desired wave and an interference wave in the circuit shown in FIG. 6. FIG. 7A shows levels of the desired wave and the interference wave (to be inputted) immediately before the digital channel filters 217 and 218, FIG. 7B shows levels of the desired wave and the interference wave (outputted) immediately after the digital channel filters 217 and 218, and FIG. 7C shows levels of digital signals corrected in level by the multiplier units 104 and 105.

Figure 8:
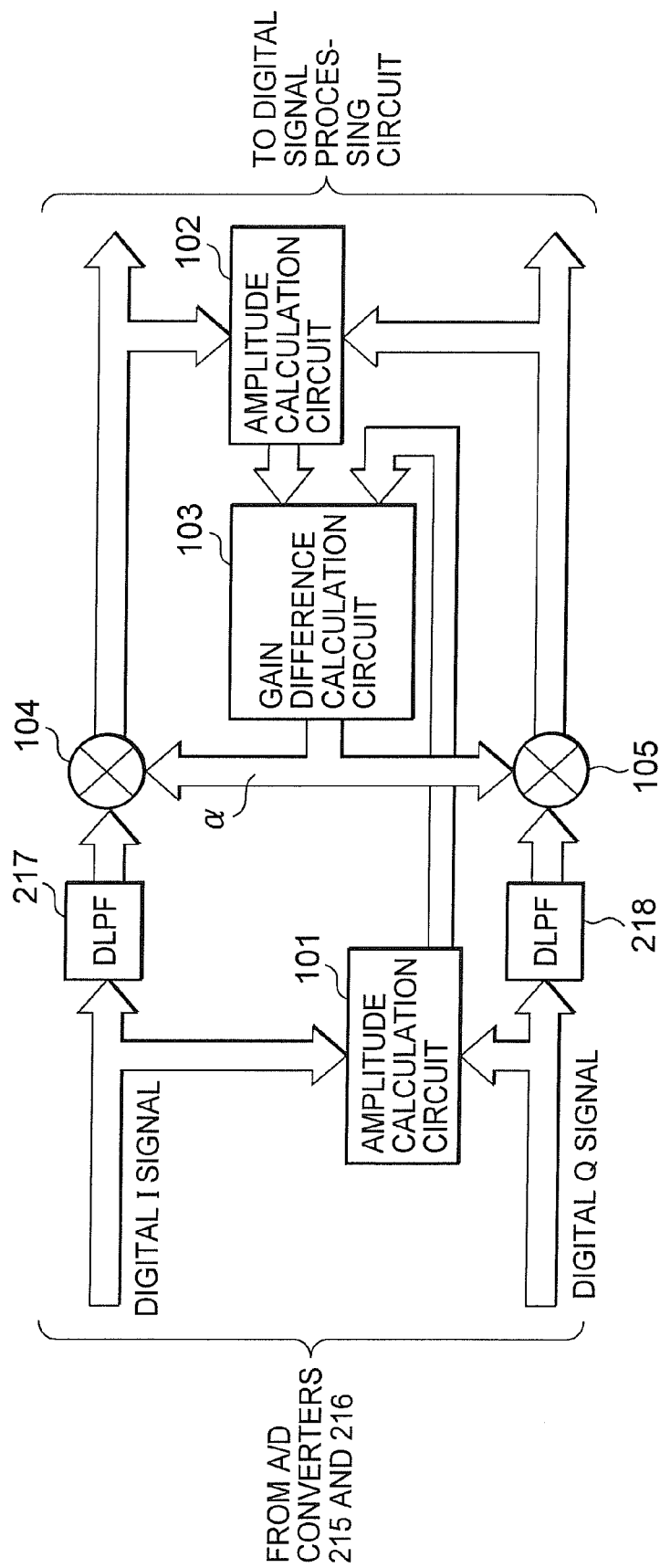
FIG. 8 is a block diagram showing an arrangement of a receiver according to another embodiment of the present invention.

FIG. 8 is a block diagram of another embodiment of a receiving amplitude correction circuit according to the present invention. Equivalent parts to those shown in FIG. 6 are denoted by the same reference numerals. As with the previous embodiment, an average amplitude of the I data and Q data immediately before the channel filters 217 and 218 is calculated by the amplitude calculation circuit 101 (first calculation unit). The present embodiment differs from the previous embodiment in that an average amplitude of the I data and Q data immediately after the multiplier units 104 and 105 is calculated by the amplitude calculation circuit 102 (second calculation unit).

Figure 1:
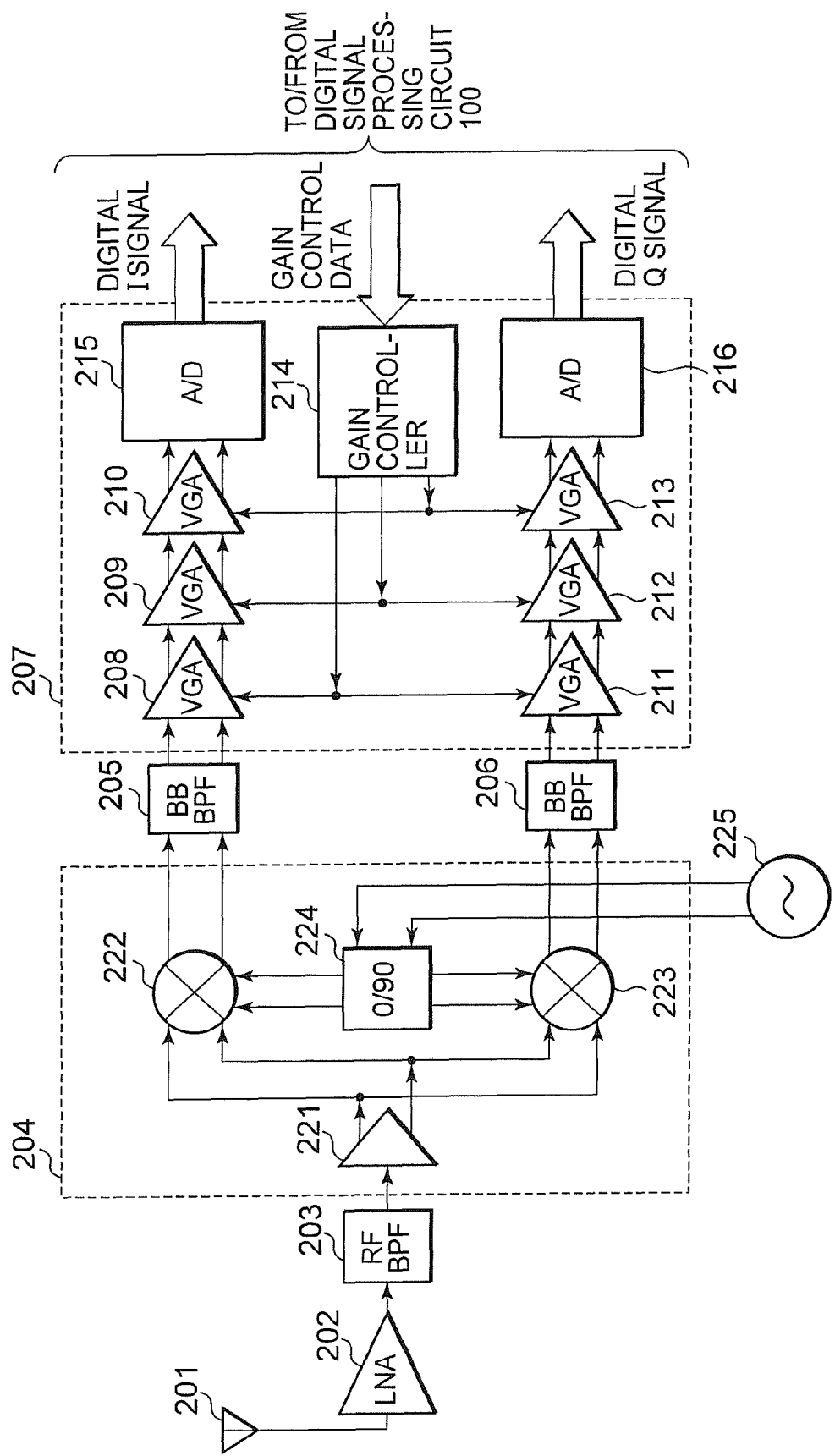
FIG. 1 is a block diagram showing an example of a receiver employing a conventional direct-conversion system.
Figure 2:
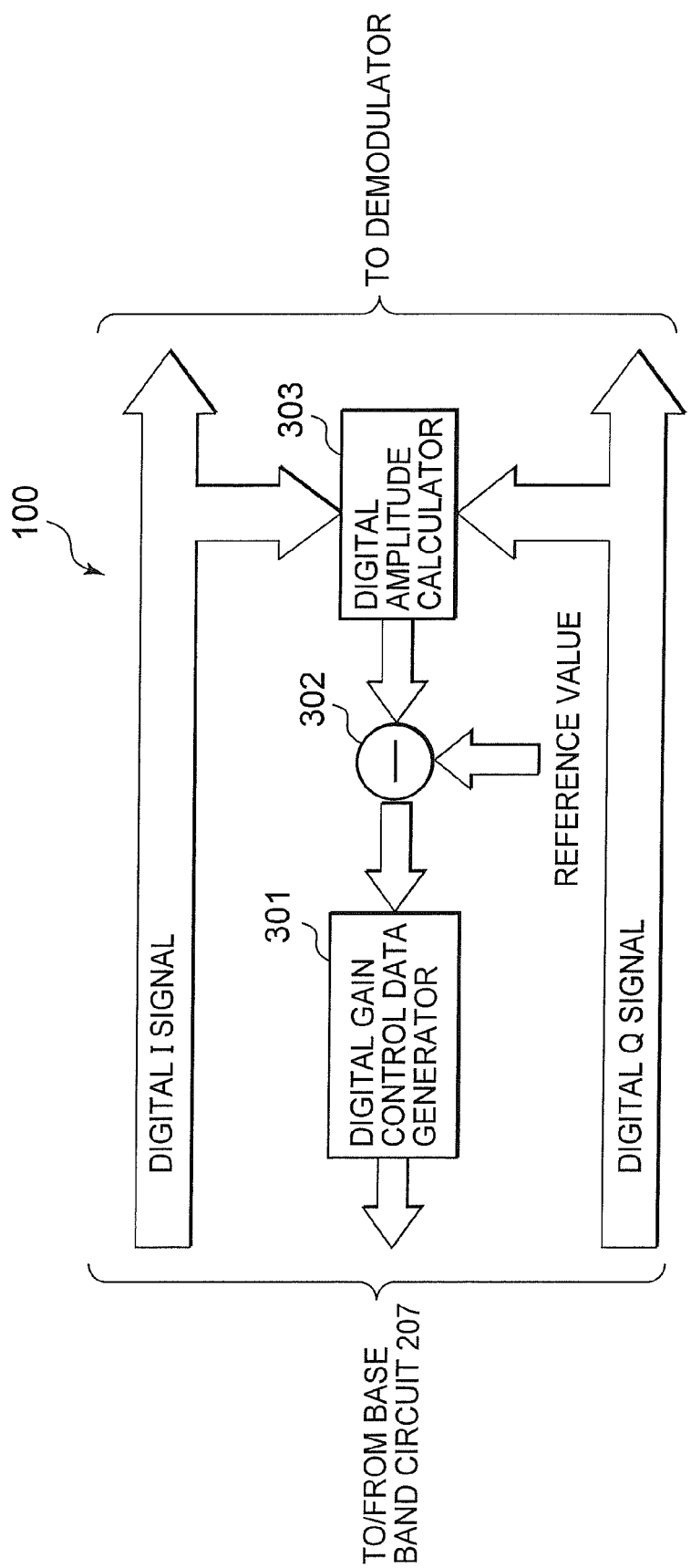
FIG. 2 is a block diagram of a digital signal processing circuit provided on the downstream side of a base band circuit shown FIG. 1.
Figure 3:
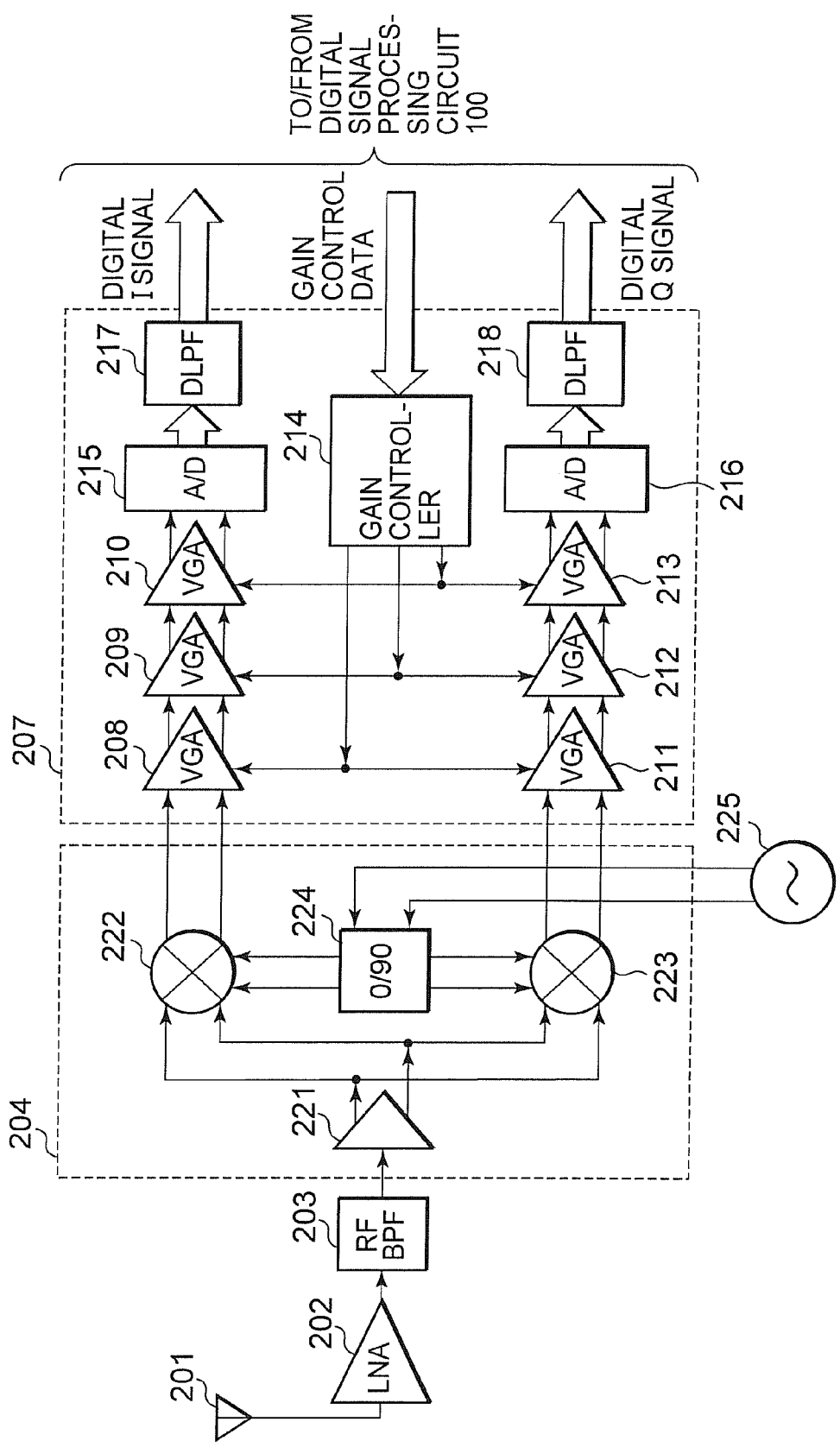
FIG. 3 is a block diagram showing another example of a receiver employing the conventional direct-conversion system.
Figure 4:
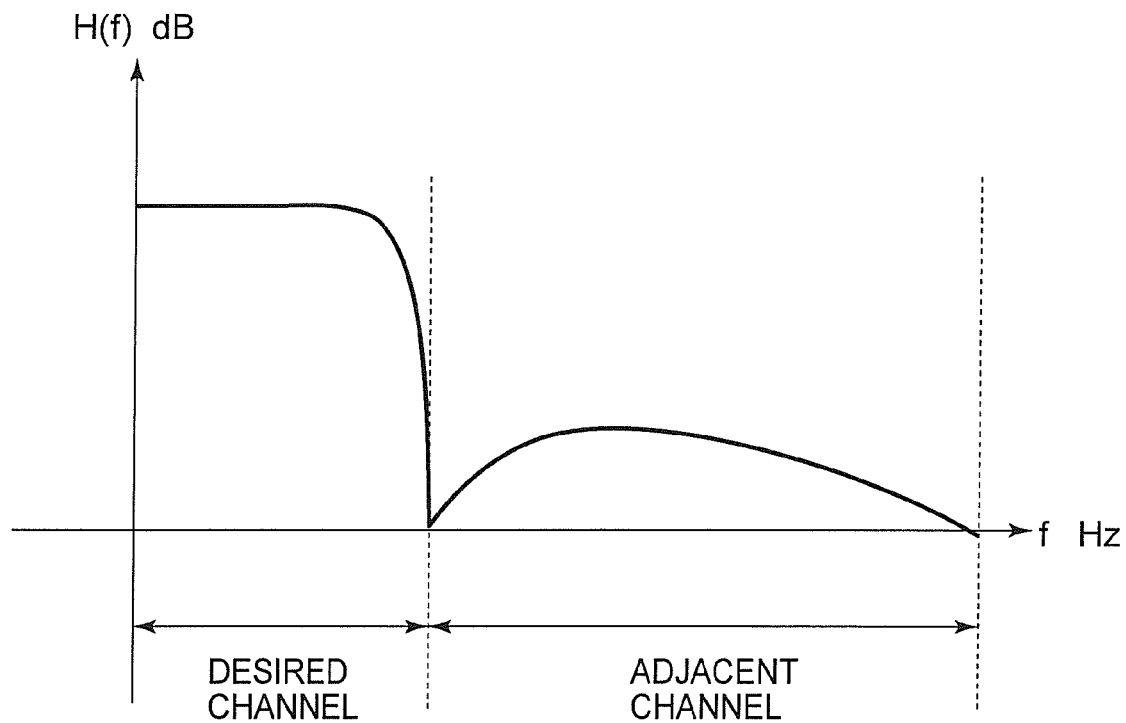
FIG. 4 is a graph showing frequency characteristics of digital low-pass filters shown in FIG. 3.
Figure 5A:
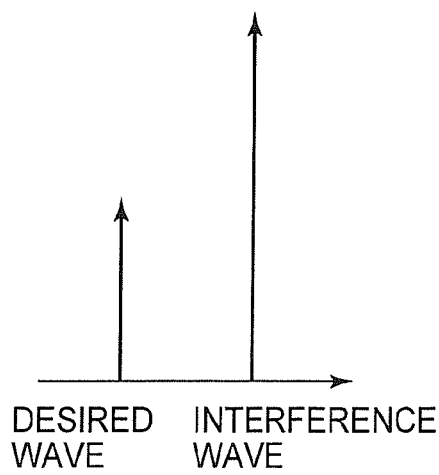
FIGS. 5A and 5B are graphs showing level changes of signals before and after the digital low-pass filters shown in FIG. 3.
Figure 5B:
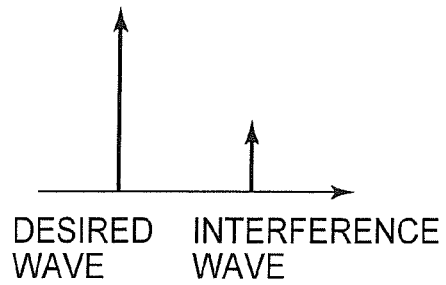

The average amplitudes calculated by the amplitude calculation circuits 101 and 102 are inputted to the gain difference calculation circuit 103 (multiplier computation unit). A multiplier a to be provided to the multiplier units 104 and 105 is computed in the gain difference calculation circuit 103. The outputs of the channel filters 217 and 218 are multiplied by the multiplier α in the multiplier units 104 and 105, respectively. Those multiplication results are introduced as a digital I signal and Q signal to the digital signal processing circuit (FIG. 2). Other components are the same as shown in FIG. 3. The amplitude calculation circuit 101 and 102, the gain difference calculation circuit 103, and the multiplier units 104 and 105 may collectively be referred to as a correction unit.

With the above arrangement, it is assumed that an average segment within which an average amplitude is computed is set to be a slot, which is a minimum unit of a communication frame, as with the previous embodiment, that the I sample value and Q sample value immediately before the channel filters 217 and 218 are Iinj and Qinj, respectively, and that the I sample value and Q sample value immediately after the multiplier units 104 and 105 are Ioutj and Qoutj, respectively. An average amplitude Ain immediately before the channel filters 217 and 218 and an average amplitude Aout immediately after the multiplier units 104 and 105 in a certain slot are defined by the same formulas as the formulas (1) and (2).

In the gain difference calculation circuit 103, assuming a multiplier α for the multiplier units 104 and 105 to be employed in the next slot and a multiplier $α_{-1}$ for the multiplier units 104 and 105 employed in the last slot, the multiplier α is defined by the following formula (4).

$$a=(Ain/Aout) \times a_{-1} \quad (4)$$

Accordingly, the outputs of the digital channel filters 217 and 218 are multiplied by the multiplier α in the multiplier units 104 and 105. Those multiplication results are introduced as a digital I signal and Q signal to the digital signal processing circuit.

By this operation in the present embodiment, the amplitude immediately before the channel filters can be made substantially equal to the amplitude immediately after the multiplier units while small fluctuations between slots are unavoidable. Here, α·k, which is obtained by multiplying α by a constant k, may be used as a multiplier. In this case, a certain level difference corresponding to the constant k can be provided to each of the level immediately before the filters and the level immediately after the multiplier units.

Accordingly, in the present embodiment, the amplitude after an interference wave has been suppressed in the channel filter can be made averagely substantially equal to the amplitude before the interference wave has been suppressed, or can be made a predetermined constant number of times as large as the amplitude before the interference wave has been suppressed. If such a function is provided on the upstream side of the digital signal processing circuit 100 shown in FIG. 2 to perform level correction, then it is possible to prevent a situation in which the signal levels of the inputs of the A/D converters 215 and 216 (FIG. 3) deviate from the A/D conversion range.

The invention claimed is:

1. A receiving amplitude correction circuit in a receiver including an A/D conversion unit that converts a received analog signal into a digital signal, a band limitation unit that limits bands of the digital signal, a digital signal processing unit that conducts a digital signal processing after the band limitation, and a gain controller that performs a gain control to control a level of the received analog signal based on a signal level in the digital signal processing unit, wherein the receiving amplitude correction circuit includes:
a correction unit that corrects digital signal amplitudes so that the amplitudes before and after the band limitation unit are made averagely equal to each other or adjusted to have a predetermined difference,
wherein the correction unit comprises a first calculation unit that calculates an average amplitude of signals immediately before the band limitation unit, a second calculation unit that calculates an average amplitude of signals immediately after the band limitation unit, and an amplitude correction unit that compares the average amplitude immediately before the band limitation unit and the average amplitude immediately after the band limitation unit and that corrects the average amplitude immediately after the band limitation unit in accordance with the comparison result, and
wherein the amplitude correction unit comprises a computation unit that computes a reciprocal of a ratio of the average amplitude immediately before the band limitation unit and the average amplitude immediately after the band limitation unit and a multiplier unit that multiplies an output of the band limitation unit by the reciprocal of the ratio or a predetermined number of times the reciprocal of the ratio.

2. The receiving amplitude correction circuit as recited in claim 1, characterized in that the correction unit uses a slot period, which is a minimum unit of communication frames, as an average segment.

3. A wireless communication apparatus comprising the receiving amplitude correction circuit as recited in claim 1.

4. A receiving amplitude correction circuit in a receiver including an A/D conversion unit that converts a received analog signal into a digital signal, a band limitation unit that limits bands of the digital signal, a digital signal processing unit that conducts a digital signal processing after the band limitation, and a gain controller that performs a gain control to control a level of the received analog signal based on a signal level in the digital signal processing unit, wherein the receiving amplitude correction circuit includes:
a correction unit that corrects digital signal amplitudes so that the amplitudes before and after the band limitation unit are made averagely equal to each other or adjusted to have a predetermined difference,
wherein the correction unit comprises a multiplier unit provided immediately after the band limitation unit, a first calculation unit that calculates an average amplitude of signals immediately before the band limitation unit, a second calculation unit that calculates an average amplitude of signals immediately after the multiplier unit, and a multiplier computation unit that compares the average amplitude immediately before the band limitation unit and the average amplitude immediately after the multiplier unit and that computes a multiplier for the multiplier unit in accordance with the comparison result.

5. The receiving amplitude correction circuit as recited in claim 4, characterized in that the multiplier computation unit computes a reciprocal of a ratio of the average amplitude immediately before the band limitation unit and the average amplitude immediately after the multiplier unit and to multiply the reciprocal of the ratio or a predetermined number of times the reciprocal of the ratio by a multiplier for a last average segment to generate a multiplier for this average segment.

6. A receiving amplitude correction method in a receiver which converts a received analog signal into a digital signal, limits bands of the digital signal by a band limitation unit, conducts digital signal processing after the band limitation by a digital signal processing unit, and performs a gain control to control a level of the received analog signal based on a signal level in the digital signal processing unit, wherein the receiving amplitude correction method includes:
a correction step of correcting digital signal amplitudes so that the amplitudes before and after the band limitation unit are made averagely equal to each other or adjusted to have a predetermined difference,
wherein the correction step comprises comparing an average amplitude of signals immediately before the band limitation unit and the average amplitude of signals immediately after the band limitation unit and correcting the average amplitude immediately after the band limitation unit in accordance with the comparison result, and
wherein the correction step comprises computing a reciprocal of a ratio of the average amplitude immediately before the band limitation unit and the average amplitude immediately after the band limitation unit and multiplying an output of the band limitation unit by the reciprocal of the ratio or a predetermined number of times the reciprocal of the ratio.

7. The receiving amplitude correction method as recited in claim 6, characterized in that the correction step comprises using a slot period, which is a minimum unit of communication frames, as an average segment.

8. A receiving amplitude correction method in a receiver which converts a received analog signal into a digital signal, limits bands of the digital signal by a band limitation unit, conducts digital signal processing after the band limitation by a digital signal processing unit, and performs a gain control to control a level of the received analog signal based on a signal level in the digital signal processing unit, wherein the receiving amplitude correction method includes:

a correction step of correcting digital signal amplitudes so that the amplitudes before and after the band limitation unit are made averagely equal to each other or adjusted to have a predetermined difference, wherein the correction step comprises comparing an average amplitude of signals immediately before the band limitation unit and the average amplitude of signals immediately after a multiplier unit provided immediately after the band limitation unit and computing a multiplier for the multiplier unit in accordance with the comparison result.

9. The receiving amplitude correction method as recited in claim 8, characterized by computing a reciprocal of a ratio of the average amplitude immediately before the band limitation unit and the average amplitude immediately after the multiplier unit and multiply the reciprocal of the ratio or a predetermined number of times the reciprocal of the ratio by a multiplier for a last average segment to generate a multiplier for this average segment.

* * * * *